United States Patent
Arai et al.

(10) Patent No.: US 7,205,501 B2
(45) Date of Patent: Apr. 17, 2007

(54) LASER MACHINING METHOD AND LASER MACHINING APPARATUS

(75) Inventors: Kunio Arai, Ebina (JP); Kazuhisa Ishii, Ebina (JP); Hiroaki Ashizawa, Ebina (JP)

(73) Assignee: Hitachi Via Mechanics, Ltd., Ebina-shi (JP)

( * ) Notice: Subject to any disclaimer, the term of this patent is extended or adjusted under 35 U.S.C. 154(b) by 0 days.

(21) Appl. No.: 10/927,185

(22) Filed: Aug. 27, 2004

(65) Prior Publication Data
US 2005/0155958 A1 Jul. 21, 2005

(30) Foreign Application Priority Data
Jan. 16, 2004 (JP) .............................. 2004-009421

(51) Int. Cl.
B23K 26/38 (2006.01)
(52) U.S. Cl. .............................. 219/121.7; 219/121.61; 219/121.62; 219/121.71; 359/305; 359/307
(58) Field of Classification Search ............. 219/121.7, 219/121.71, 121.61, 121.62, 121.83; 359/305, 359/307, 315
See application file for complete search history.

(56) References Cited

U.S. PATENT DOCUMENTS

| | | | |
|---|---|---|---|
| 5,073,687 A * | 12/1991 | Inagawa et al. ......... | 219/121.7 |
| 5,107,586 A * | 4/1992 | Eichelberger et al. ........ | 29/830 |
| 5,340,975 A * | 8/1994 | Vogelgesang .......... | 219/121.62 |
| 6,229,113 B1 * | 5/2001 | Brown ..................... | 219/121.7 |
| 6,479,788 B1 * | 11/2002 | Arai et al. ............. | 219/121.71 |
| 6,521,866 B1 | 2/2003 | Arai et al. | |
| 6,787,733 B2 * | 9/2004 | Lubatschowski et al. ..................... | 219/121.72 |
| 6,849,823 B2 * | 2/2005 | Edme et al. ............. | 219/121.7 |
| 2005/0274702 A1 * | 12/2005 | Deshi ..................... | 219/121.72 |

FOREIGN PATENT DOCUMENTS

EP 544398 A1 * 6/1993

* cited by examiner

*Primary Examiner*—Geoffrey S. Evans
(74) *Attorney, Agent, or Firm*—Crowell & Moring LLP

(57) ABSTRACT

A laser machining method and a laser machining apparatus superior in hole position accuracy and hole quality. An outgoing beam outputted as short pulses is shaped by a pulse shaping unit so as to form a #1 branch beam. The #1 branch beam is supplied to a portion to be machined, so as to machine the portion. In this case, the #1 branch beam may be controlled to synchronize with the outgoing beam. When a piece to be machined is made from a metal material and at least one of an organic material and an inorganic material, the metal material is machined with a laser beam shaped to have a pulse width not shorter than 100 ns, and at least one of the organic material and the inorganic material is machined with a laser beam shaped to have a pulse width shorter than 100 ns.

5 Claims, 11 Drawing Sheets

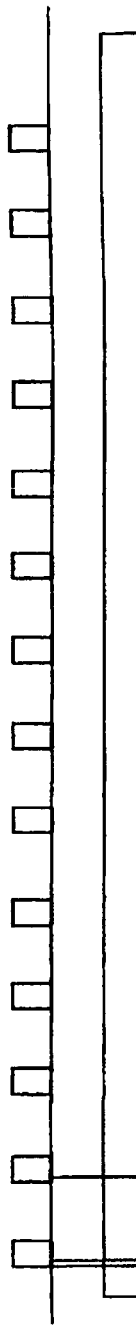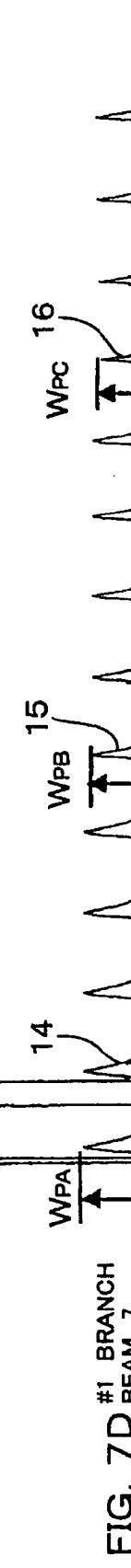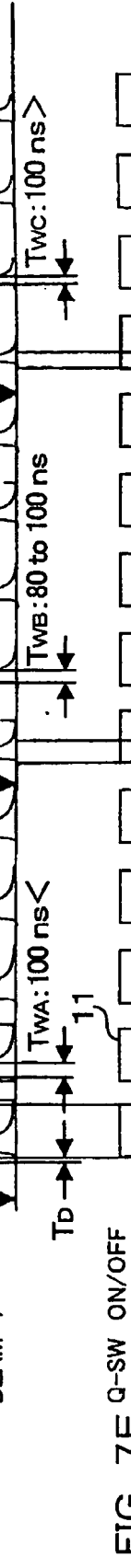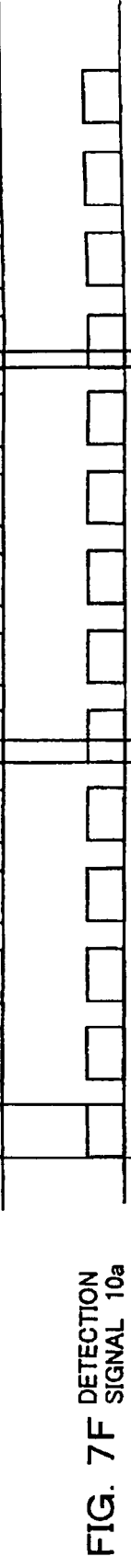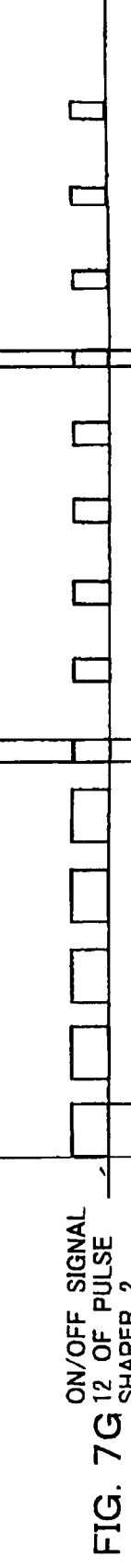
FIG. 7A OUTPUT INSTRUCTION SIGNAL 9,10
FIG. 7B LD CURRENT VALUE
FIG. 7C OUTGOING BEAM 6
FIG. 7D #1 BRANCH BEAM 7
FIG. 7E Q-SW ON/OFF SIGNAL 11
FIG. 7F DETECTION SIGNAL 10a
FIG. 7G ON/OFF SIGNAL 12 OF PULSE SHAPER 2

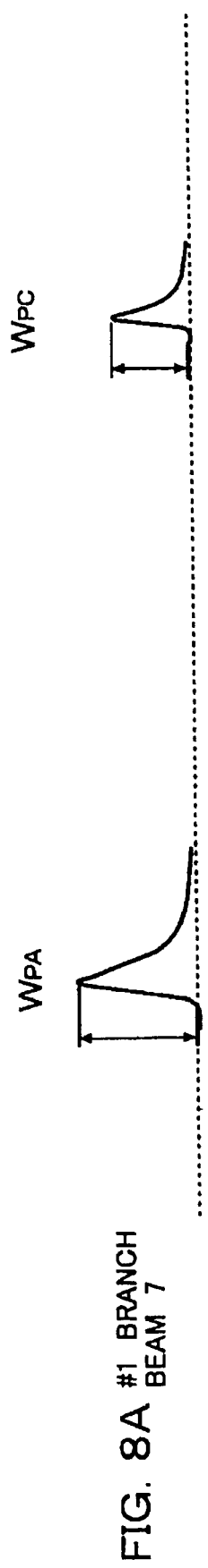
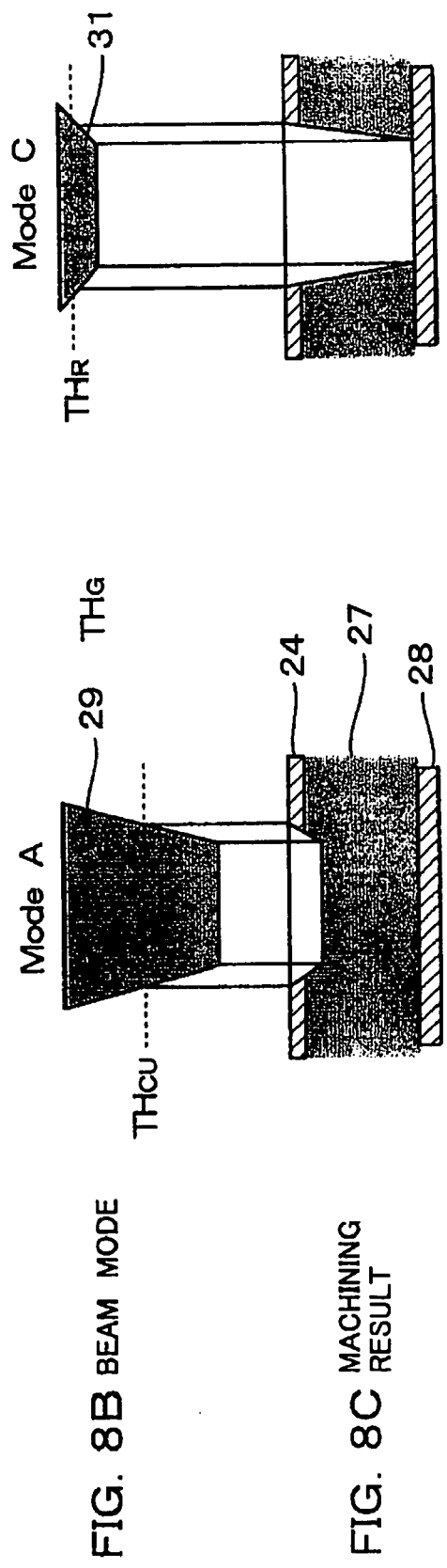
FIG. 8A #1 BRANCH BEAM 7
FIG. 8B BEAM MODE
FIG. 8C MACHINING RESULT

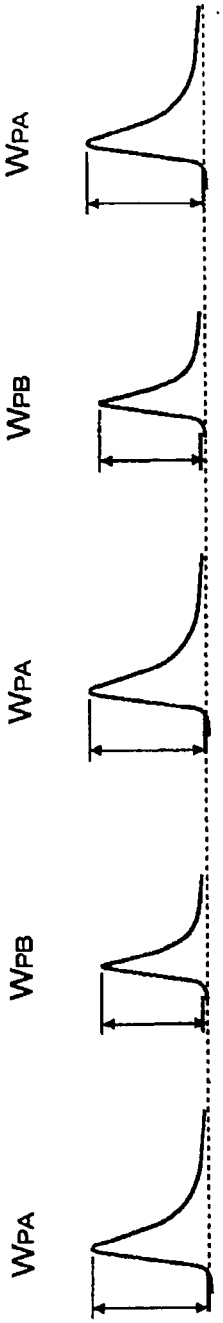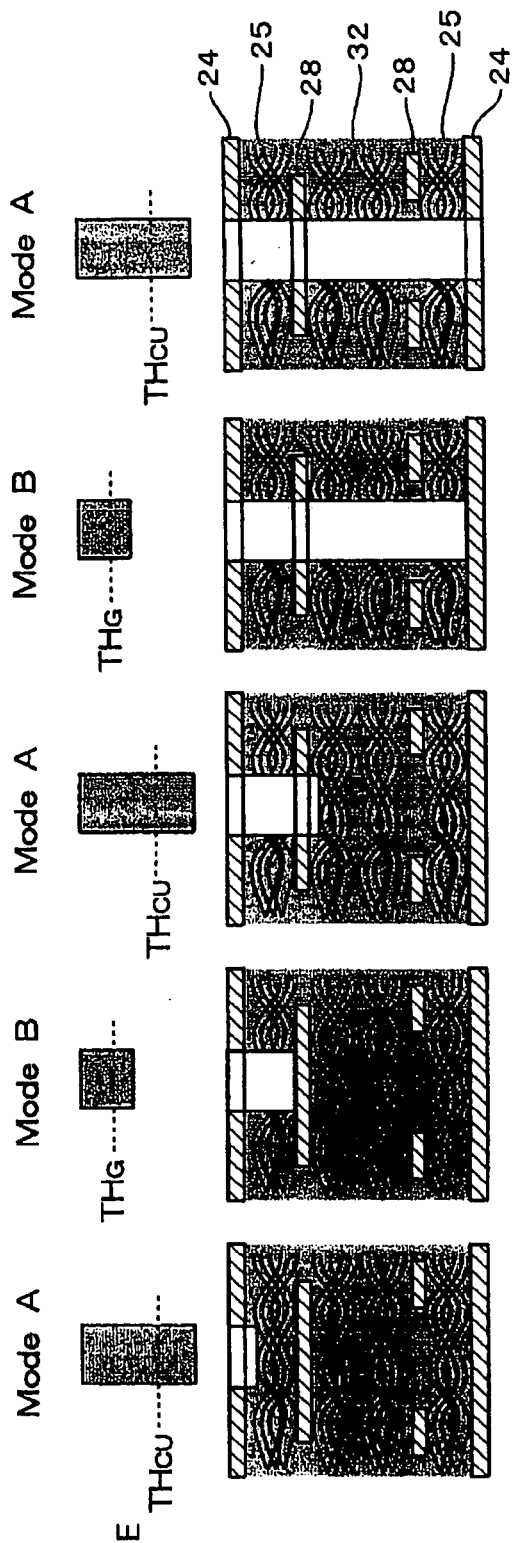
FIG. 9A #1 BRANCH BEAM 7
FIG. 9B BEAM MODE
FIG. 9C MACHINING RESULT

LASER MACHINING METHOD AND LASER MACHINING APPARATUS

FIELD OF THE INVENTION

The present invention relates to a laser machining method and a laser machining apparatus suitable for machining printed circuit boards or semiconductor devices.

BACKGROUND ART OF THE INVENTION

Pulse energy of a UV laser depends on its emission duration and its excitation duration. Accordingly, higher pulse energy can be generally obtained as the pulse repetition frequency is lower, while the pulse energy becomes lower as the pulse repetition frequency increases.

The peak output and the pulse width depend on the pulse repetition frequency, the kind and the length of the crystal generating the fundamental wave, and the LD (laser diode) output exciting the crystal. Accordingly, the higher the pulse repetition frequency is, the longer the emission duration (that is, the pulse width) is. When the pulse repetition frequency is low, there is a fear that the crystal is damaged. Therefore, the crystal is protected to generate no wave in the low frequency range, and the maximum output frequency is adjusted to be slightly higher than the lower limit frequency. The peak output is lowered gradually with increase of the frequency.

FIG. 10 is a graph showing the output characteristic of a typical high-peak short-pulse-width $YVO_4$ UV laser applied to machining printed circuit boards.

The $YVO_4$ UV laser has an external cavity structure containing a fundamental wave generation crystal and a wavelength conversion crystal for the third harmonic generation (THG). When a Q switch (Q-SW) is turned on, a fundamental wave whose wavelength is 1,064 nm is generated, and the wavelength is converted at the same time. Since an electro-optic device of polarization modulation type having a high response speed is used as the Q-SW, there hardly appears a residual fundamental wave, and the pulse width is narrow. However, the peak intensity is so high that the crystal is apt to be damaged. Therefore, the position of the wavelength conversion crystal is shifted periodically so that the device life is secured.

As shown in FIG. 10, the maximum average output is about 11 W at the pulse frequency 40 kHz. However, the average output becomes lower with increase of the frequency, and it reaches about 5.5 W at 100 kHz. When the frequency is increased, there is a small change in the pulse leading edge, but the pulse width increases from 25 ns to 35 ns in the pulse trailing edge with a gradual slope. The pulse energy is reduced to 25% at 100 kHz in comparison with that at 50 kHz, and the peak output is reduced to 19%.

FIG. 11 is a graph showing the output characteristic of a typical low-peak long-pulse-width YAG UV laser applied to machining printed boards in the same manner as the $YVO_4$ UV laser. For the sake of comparison, the pulse width of the $YVO_4$ UV laser shown in FIG. 10 is illustrated by the broken line.

The YAG UV laser has an internal cavity structure containing a fundamental wave generation crystal and a THG wavelength conversion crystal. When a Q-SW is turned on, a fundamental wave is generated, and the wavelength is converted at the same time. Since an acousto-optic device having a low response speed is used as the Q-SW, the fundamental wave keeps passing through the conversion crystal even after the Q-SW is turned off and till the passage of the beam is terminated. Therefore, the output duration, that is, the pulse width is long, but the peak intensity is so low that the damage to the crystal can be reduced.

As shown in FIG. 11, the maximum average output is about 11 W at the pulse frequency 40 kHz. However, the average output becomes lower with increase of the frequency, and it reaches about 5.5 W at 100 kHz. When the frequency is increased, there is a small change in the pulse leading edge, but the pulse width increases from 130 ns to 180 ns in the pulse trailing edge with a steep slope. The pulse energy is reduced to 25% at 100 kHz in comparison with that at 50 kHz, and the peak output is reduced to 15%.

When FIGS. 10 and 11 are compared with each other, the average output is substantially identical between the both in a range of the pulse frequency 40–100 kHz. However, when the peak output at the frequency 50 kHz in the $YVO_4$ UV laser is regarded as reference (100%), the peak output at the frequency 50 kHz in the YAG UV laser is 20%, and the peak output at the frequency 100 kHz is about 4%.

As is apparent from FIGS. 10 and 11, the pulse width of the conventional lasers depends on the frequency. In the case of the $YVO_4$ UV laser, the pulse widths are limited in the range of 20–35 ns, and in the case of the YAG UV laser, the pulse widths are limited in the range of 130–180 ns. It is therefore impossible to perform machining with pulse widths in the range suitable for machining insulating layers, which range is shown by the shaded portion in FIG. 11.

The following relations are established among the average output, the peak output, the pulse energy, the pulse frequency, the pulse width, the material removal quantity, the energy density and the output density.

pulse energy (J)=average output (W)/pulse frequency (Hz)

peak output (W)=pulse energy (J)/pulse width (s)

removal quantity ∝pulse energy/number of pulses energy density $(J/cm^2)$=pulse energy (J)/beam area $(cm^2)$ output density $(W/cm^2)$=peak output (W)/beam area $(cm^2)$ That is, the pulse energy is in inverse proportion to the pulse frequency, and the peak output is in inverse proportion to the pulse width. Typically the output density (energy density per unit time) is much larger than decomposition thresholds of materials except metal materials, such as copper, having high thermal conductivities. Therefore, the removal quantity is substantially in proportion to the total energy (pulse energy×number of pulses). Accordingly, when machining is performed near the maximum output, the efficiency can be improved, and the machining speed can be increased.

On the other hand, in the case of an FR-4 material which is a typical printed circuit board material, the necessary energy density and the energy density threshold of a copper conductor layer is about 10 times larger than that of an insulating layer (layer of glass fiber impregnated with resin) (copper:glass fiber:resin≅10:3:1) due to differences in material properties. In addition, there are optimal conditions for each material. Specific description will be made below.

(1) When the energy density and the output density are too high in the case where the copper conductor layer on the surface is machined, the insulating layer just under the copper conductor layer is machined with the high power as soon as the conductor layer is removed. Thus, the resin is removed, so that the large undercut is formed in the insulating layer. On the contrary, when the energy density and the output density are too low, supplied heat diffuses to the periphery of the portion to be machined, so that the removal quantity per pulse is reduced. Therefore, the number of pulses increases, so that the machining speed is slowed down. From above, the energy density and the output density suitable for machining the copper conductor layer are in the range of about 5–10 J/cm$^2$ and in the range of about 150–300 MW/cm$^2$ respectively in the case of a high-peak short-pulse-width laser, and in the range of about 10–20 J/cm$^2$ and in the range of about 100–200 MW/cm$^2$ respectively in the case of a low-peak long-pulse-width laser.

(2) When the energy density and the output density are too high in the case where the impregnated glass fiber is machined, the resin around the glass fiber is removed by surface reflected light, so that the projecting length of the glass fiber from the resin surface is increased. In addition, when the remaining amount of the insulating layer is reduced due to the progress of machining, the copper conductor layer at the hole bottom is injured. On the contrary, when the energy density and the output density are too low, the removal quantity per pulse is reduced, so that the number of pulses increases. Thus, the machining speed is slowed down.

From above, the energy density and the output density suitable for machining the glass fiber are in the range of about 2–6 J/cm$^2$ and in the range of about 100–200 MW/cm$^2$ respectively in the case of a high-peak short-pulse-width laser, and in the range of about 3–8 J/cm$^2$ and in the range of about 60–120 MW/cm$^2$ respectively in the case of a low-peak long-pulse-width laser (3) When the energy density and the output density are too high in the case where the resin is machined, the copper conductor layer at the hole bottom is injured. On the contrary, when the energy density and the output density are too low, the residue of the resin at the hole bottom is increased. In addition, the number of pulses increases so that the machining speed is slowed down.

From above, the energy density and the output density suitable for machining the resin are in the range of about 0.5–1.5 J/cm$^2$ and in the range of about 15–30 MW/cm$^2$ respectively in the case of a high-peak short-pulse-width laser, and in the range of about 0.7–1.5 J/cm$^2$ and in the range of about 10–20 MW/cm$^2$ respectively in the case of a low-peak long-pulse-width laser.

As is apparent from the aforementioned description, based on the hole quality, the hole shape and the machining speed, there are an upper limit and a lower limit in thresholds of the energy density and the output density suitable for each material to be machined. When machining is performed near the maximum output, the hole quality or the hole shape deteriorates. For example, when a hole having a diameter of 50 μm is machined in the copper conductor layer, the glass fiber and the resin using the UV lasers shown in FIGS. 10 and 11, practical pulse frequencies are limited to a range of about 40 Hz or lower, a range of about 60 kHz or lower and a range of about 100 kHz or lower respectively in term of suitable energy density and suitable output density.

Therefore, in the background art, machining is performed while changing the pulse frequency in a range of from 40 kHz to 100 kHz on the basis of energy (or peak output) required for machining the copper conductor layer, the glass fiber and the resin with the progress of machining (that is, whenever the material to be machined is changed). Alternatively, machining is performed while determining the pulse frequency on the basis of energy (or peak output) required for machining the copper conductor layer, and changing the LD output (that is, the output of a laser oscillator) for the glass fiber and the resin without changing the pulse frequency, so as to machine them with the adjusted energy (or peak output).

In order to stabilize the output of the UV laser, it is necessary to control the temperature of the wavelength conversion crystal within 0.1° C. That is, either when the pulse frequency is changed or when the peak output is controlled by the LD output, if an SHG or THG wavelength conversion crystal (LBO, CLBO or BBO) is off thermal balance, the beam outgoing angle will fluctuate due to fluctuation in refractive index caused by fluctuation in crystal temperature. As a result, the hole position accuracy or the hole shape will deteriorate.

However, even when the temperature of the wavelength conversion crystal was controlled within 0.1° C., there occurred a fluctuation in beam outgoing angle of, for example, 40 μrad at a frequency of 60 kHz and 60 μrad at a frequency of 80 kHz with respect to that at a frequency of 40 kHz due to a time lag or the like. As a result, the hole position accuracy deteriorated up to about 5 μm. In addition, the hole quality and the hole shape deteriorated due to a fluctuation in output and a broken beam mode (spatial energy distribution).

Further, since conditions suitable for each material cannot be secured, desired hole position accuracy, desired hole quality and desired hole shape could not be obtained.

Therefore, for example, JP-A-2002-335063 discloses a machining method in which the pulse frequency is fixed, while the peak output is changed over outside a laser oscillator so as to machine a copper conductor layer with high energy density and high output density, then changed over to middle energy density and middle output density to thereby machine glass, and finally changed over to low energy density and low output density to thereby machine resin.

According to the technique disclosed in JP-A-2002-335063, the pulse frequency and the peak output can be set for each of the copper conductor layer, the glass fiber and the resin. However, when the peak output is reduced while the pulse width is increased, the resin residue at the hole bottom increases. In order to reduce the resin residue, it is therefore necessary to reduce the pulse width while increasing the peak output.

SUMMARY OF THE INVENTION

To solve the foregoing problem belonging to the background art, it is an object of the invention to provide a laser machining method and a laser machining apparatus superior in hole position accuracy and hole quality.

In order to attain the foregoing objects, according to a first configuration of the present invention, there is provided a laser machining method including the steps of shaping the waveform of a laser beam outputted as short pulses, and supplying the shaped laser beam to a portion to be machined.

According to a second configuration of the present invention, there is provided a laser machining apparatus including a laser oscillator for outputting a pulsed laser beam so as to machine a to-be-machined piece with the pulsed beam wherein a pulse shaper is provided and disposed on an optical path of the laser beam, and machining is performed using the first configuration of the present invention.

According to the present invention, the waveform of the laser beam outputted as short pulses is shaped, and the shaped laser beam is supplied to a portion to be machined. Accordingly, laser machining superior in hole position accuracy and hole quality can be performed.

BRIEF DESCRIPTION OF THE DRAWINGS

FIGS. 7A–7G are time charts showing the operation of the second embodiment of the present invention;

FIGS. 8A–8C are diagrams showing an example of machining according to the present invention;

FIGS. 9A–9C are diagrams showing an example of machining according to the present invention;

PREFERRED EMBODIMENTS OF THE INVENTION

Embodiments of the present invention will be described below with reference to the drawings.

First Embodiment

Figure 1:
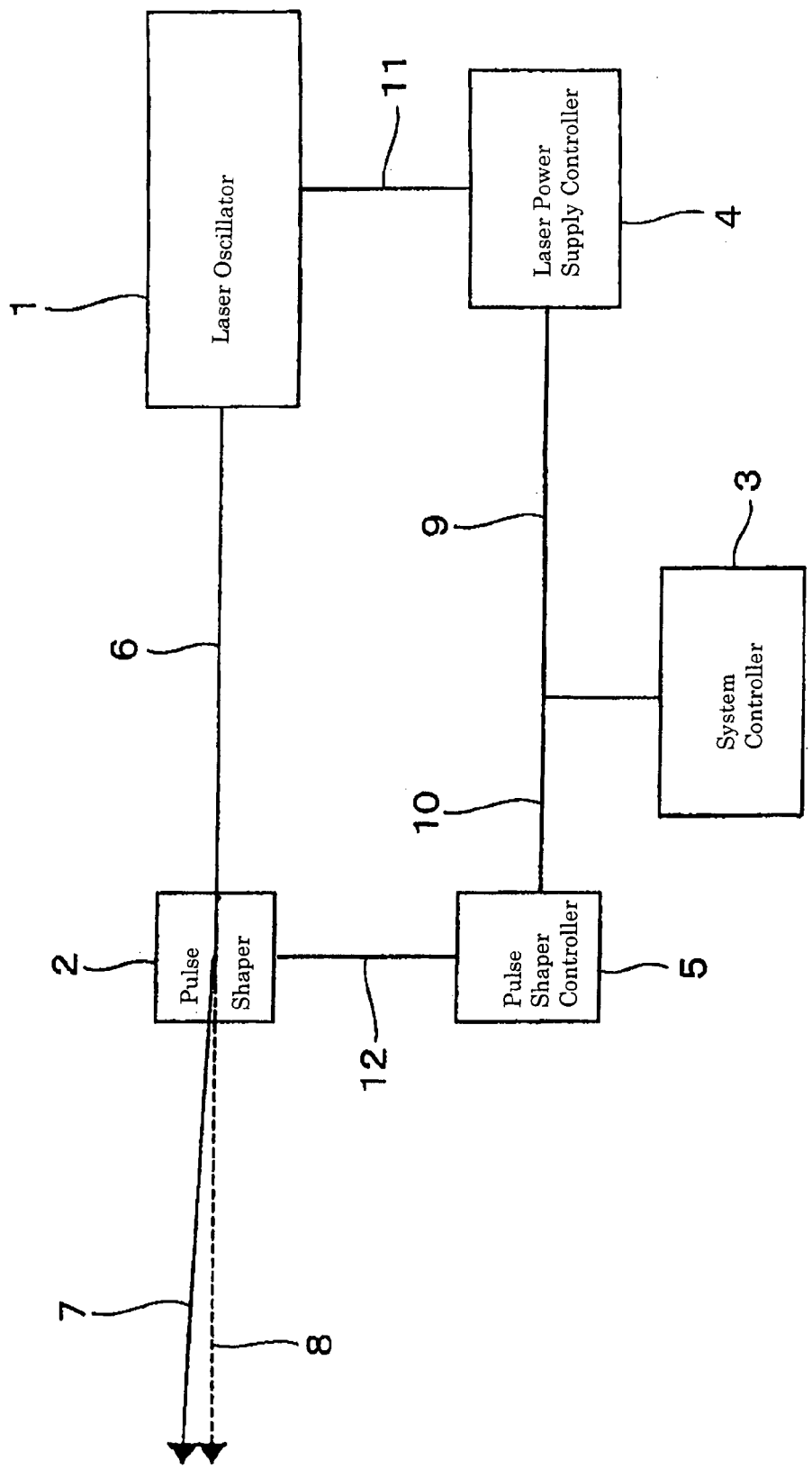
FIG. 1 is a configuration diagram of a laser machining apparatus according to a first embodiment of the present invention.

FIG. 1 is a configuration diagram of a laser machining apparatus according to a first embodiment of the present invention.

A laser oscillator 1 for outputting a YAG UV laser beam is connected to a system controller 3 through a laser power supply controller 4. A pulse shaper 2 disposed on the optical axis of an outgoing beam 6 outputted from the laser oscillator 1 is connected to the system controller 3 through a pulse shaper controller 5. A #1 branch beam 7 (machining beam) is guided to a not-shown portion to be machined, while a #0 branch beam 8 is guided to a not-shown damper so as to be converted into heat. The laser power supply controller 4 outputs an on/off signal 11 for a Q-SW disposed inside the laser oscillator 1, based on a pulse output instruction signal 9 defining the pulse mode (pulse width, that is, frequency and peak output) of the outgoing beam 6. The pulse output instruction signal 9 is outputted from the system controller 3.

The pulse shaper controller 5 outputs an on/off signal 12 for controlling the pulse shaper 2 (AOM or EOM, herein AOM), based on an output instruction signal 10 defining the pulse mode (peak output and pulse width), so that the #1 branch beam 7 to be used for machining is formed from the outgoing beam 6. The pulse output instruction signal 10 is outputted from the system controller 3. Incidentally, the pulse shaper 2 can control transmittance and control the peak output of outgoing light with respect to incoming light within a range of 100–20%.

Next, the operation in this embodiment will be described.

Figure 2:
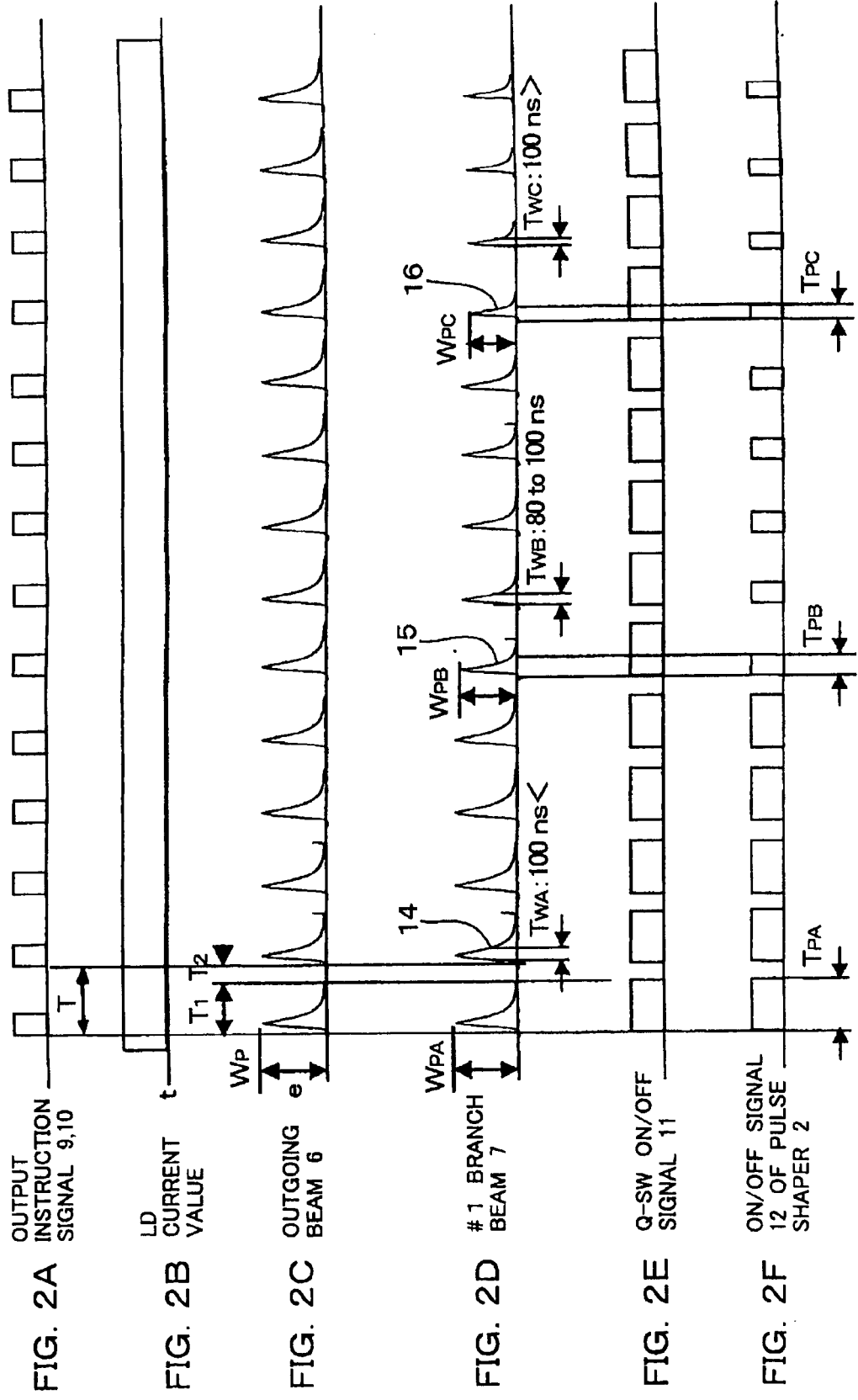
FIGS. 2A–2F are time charts showing the operation of the present invention.

FIGS. 2A–2F are time charts showing the operation. FIG. 2A shows the pulse output instruction signal 9 and the output instruction signal 10. FIG. 2B shows the value of a current supplied to a laser diode (LD) inside the laser oscillator 1. FIG. 2C shows the outgoing beam 6. FIG. 2D shows the #1 branch beam 7. FIG. 2E shows the on/off signal 11 of the Q-SW. FIG. 2F shows the on/off signal 12 of the pulse shaper 2.

A current is always supplied to the LD. When the Q-SW is turned on by the pulse output instruction signal 9, the outgoing beam 6 is outputted. When the pulse shaper 2 is turned on by the output instruction signal 10, the #1 branch beam 7 is supplied to the portion to be machined.

In FIGS. 2A–2F, Q-SW on-time T1 corresponds to laser output time, Q-SW off-time T2 corresponds to laser gain storage time, and T1+T2 corresponds to a pulse period T. As the off-time T2 is longer (that is, the pulse period T is longer), the laser gain storage becomes larger, and the peak output WP of the outgoing beam 6 becomes higher. When on-time (TPA, TPB or TPC in FIG. 2F) of the pulse shaper 2 is changed within the Q-SW on-time T1, the pulse width of the #1 branch beam 7 can be adjusted.

TWA, TWB and TWC in FIG. 2D designate real pulse widths (half widths which are general measures) of the #1 branch beam 7 in the on-times TPA, TPB and TPC of the pulse shaper 2 respectively. Peak outputs corresponding to the real pulse widths are WPA, WPB and WPC respectively.

Description will be made further about the pulse shape of the #1 branch beam 7.

Figure 3:
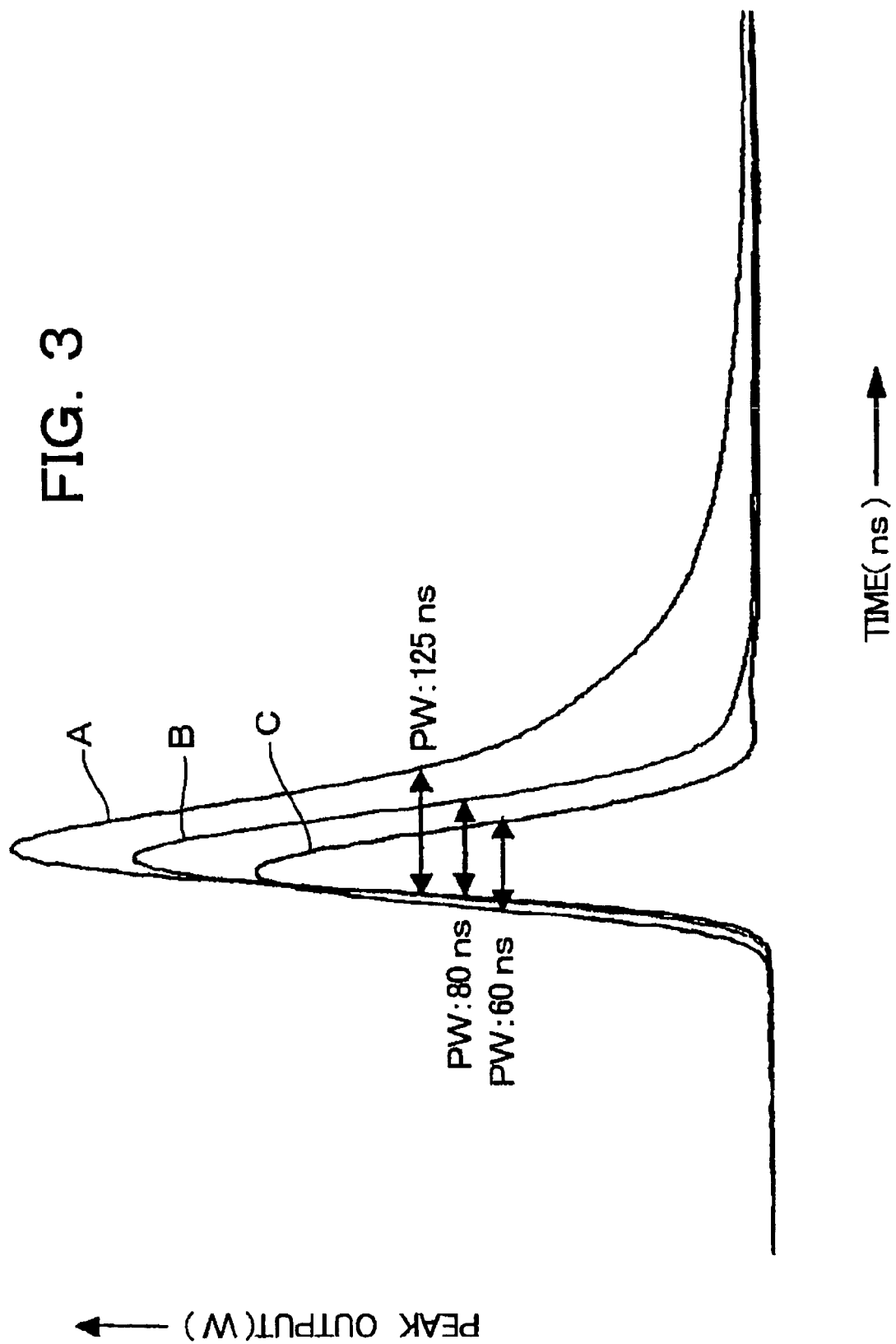
FIG. 3 is a chart showing the relationship between an outgoing beam 6 and a #1 branch beam 7 in the present invention.

FIG. 3 is a graph showing the relationship between the outgoing beam 6 and the #1 branch beam 7. Incidentally, the transmittance of the pulse shaper 2 is 100%. The waveform A in FIG. 3 (corresponding to the waveform 14 in FIG. 2D) is a waveform of the #1 branch beam 7 when the on-time TPA of the pulse shaper 2 is set to make the pulse width TWA equal to 125 ns. The waveform B (corresponding to the waveform 15 in FIG. 2D) is a waveform of the #1 branch beam 7 when the on-time TPB of the pulse shaper controller 5 is set to make the pulse width TWB equal to 80 ns. The waveform C (corresponding to the waveform 16 in FIG. 2D) is a waveform of the #1 branch beam 7 when the on-time TPC of the pulse shaper 2 is set to make the pulse width TWC equal to 60 ns.

For example, when the waveform A and the waveform C are compared, as shown in FIG. 3, there is no difference between their pulse leading edges. However, the energy of the waveform C from which the energy of its pulse tail portion (the second half portion of the pulse) has been removed becomes about ¼ as high as that of the waveform A. Accordingly, when the on-time and the transmittance of the pulse shaper 2 are changed, the energy of the #1 branch beam 7 can be adjusted accurately within a range of 100–5% of the energy of the outgoing beam 6.

Figure 4:
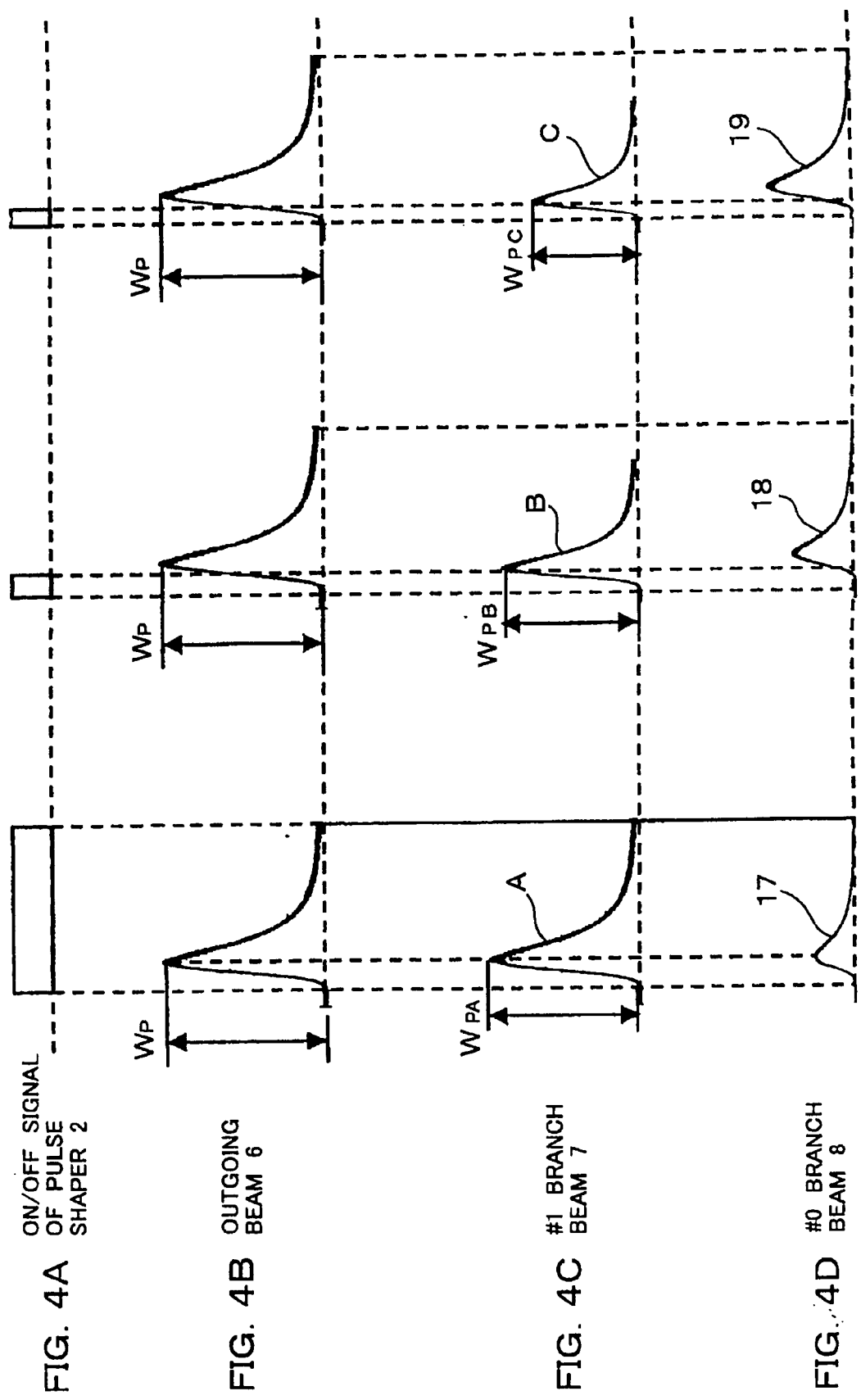
FIGS. 4A–4D are charts showing the relationship among the outgoing beam 6, the #1 branch beam 7 and a #0 branch beam 8 in the present invention.

FIGS. 4A–4D are charts showing the relationship among the outgoing beam 6, the #1 branch beam 7 and the #0 branch beam 8. Since the energy of the #0 branch beam 8 corresponds to a difference between the energy of the outgoing beam 6 and the energy of the #1 branch beam 7, the #0 branch beam 8 has a waveform 17, 18 or 19 shown in FIG. 4D. Incidentally, FIG. 4A shows the on/off signal 12 (FIG. 2F) of the pulse shaper 2, FIG. 4B shows the outgoing beam 6 (FIG. 2C), and FIG. 4C shows the #1 branch beam 7 (FIG. 2D).

Next, description will be made about a specific example of machining.

Figure 5:
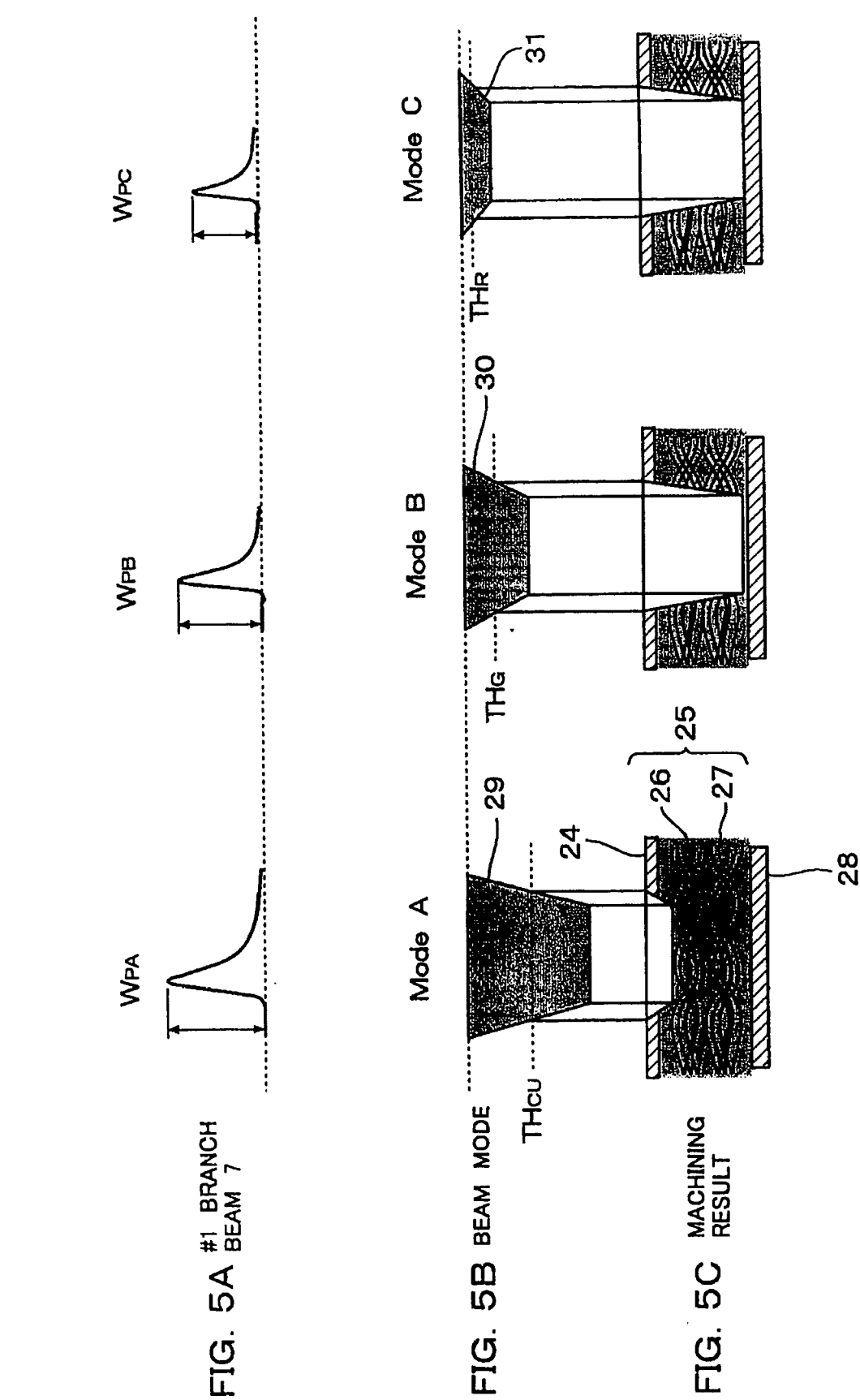
FIGS. 5A–5C are diagrams showing the relationship between a piece to be machined and a peak output in the present invention.

FIGS. 5A–5C are diagrams showing the relationship between the piece to be machined and the peak output. FIG. 5A shows the #1 branch beam 7, FIG. 5B shows thresholds peculiar to beam modes and materials, and FIG. 5C shows machining results. In the case of a glass-containing material, an insulating layer 25 having glass fiber 26 and resin 27 integrated with each other is disposed between a copper conductor layer 24 which is an outer layer and a copper conductor layer 28 which is an inner layer or a back surface. The ratio of the energy threshold $TH_{CU}$ of copper to the energy threshold $TH_G$ of glass to the energy threshold $TH_R$ of resin is about 10:3:1. A hole superior in shape accuracy and having no residual resin 27 at the hole bottom can be machined in the following manner. That is, the copper conductor layer 24 is irradiated with the #1 branch beam 7 (for example, the waveform A shown in FIG. 3) having a pulse width not shorter than 100 ns according to a beam mode 29 a predetermined number of times. The glass fiber 26 is irradiated with the #1 branch beam 7 (for example, the waveform B shown in FIG. 3) having a pulse width shorter than about 100 ns according to a beam mode 30 a predetermined number of times. The resin 27 at the hole bottom is irradiated with the #1 branch beam 7 (for example, the waveform C shown in FIG. 3) having a pulse width shorter than about 100 ns according to a beam mode 31 a predetermined number of times.

Description will be made more specifically.

1) About Machining Quality

For example, the copper conductor layer was machined in the conditions of a pulse frequency of 40 kHz, a pulse width not shorter than 100 ns, an energy density of about 12 J/cm$^2$, and an output density of about 160 MW/cm$^2$. Subsequently the glass was machined in the conditions of a pulse width shorter than 100 ns, an energy density of about 4 J/cm$^2$, and an output density of about 70 MW/cm$^2$. Further the resin was machined in the conditions of a pulse width not longer than 80 ns, an energy density of about 1 J/cm$^2$, and an output density of about 12 MW/cm$^2$. As a result, machining superior in hole quality could be attained.

When the resin is machined, the removal quantity can be fixed independently of the pulse width or the peak output if the machining energy is fixed. However, damage of the hole bottom and a resin residue at the hole bottom have a trade-off relationship. When the peak output is low and the pulse width is long, the resin residue at the hole bottom increases. On the other hand, when a laser beam is formed into short pulses in the condition that the frequency is lowered and the peak output is secured, the resin residue can be reduced so that the hole quality is improved.

When a blind hole (closed-end hole) is machined with a UV laser, the energy absorptivity of the material is comparatively high, so that the hole bottom will be injured if the energy distribution is uniform. To this end, it is desired that the beam shape of the #1 branch beam 7 is shaped into a so-called top-hat beam by a not-shown beam shaping unit.

2) About Machining Position Accuracy

For example, when an FR-4 material having a copper conductor layer 12 μm thick and an insulating layer 80 μm thick is machined, the number of pulses required for machining is 10–15 pulses for the copper conductor layer, 50–70 pulses for a glass portion of the insulating layer, and 5–10 pulses for the hole bottom. Therefore, in a background art method for adjusting the pulse frequency and the LD current, a hole position accuracy error in optics is about 5 μm because the fluctuation of the beam outgoing angle caused by the thermal fluctuation of a crystal is about 60 μrad.

On the other hand, according to the present invention (that is, the configuration in which the pulse frequency and the pulse output are fixed while the real pulse width and the real peak output are adjusted outside the oscillator), the thermal fluctuation of a crystal is minimized so that the beam outgoing angle fluctuation is reduced to 20 μrad at a maximum. Thus, a hole position accuracy error in optics can be suppressed up to 2 μm.

In the present invention, both the beam output and the pulse width can be adjusted in one and the same beam. As a result, the output adjustable range is expanded to 20 times, so that the FR-4 material (made from copper and glass-fiber-containing resin) having a difference of about 10 times between energy thresholds of its components can be machined with high quality.

The Q-SW on/off signal 11 can be delayed for time TD behind the pulse output instruction signal 9.

Second Embodiment

Figure 6:
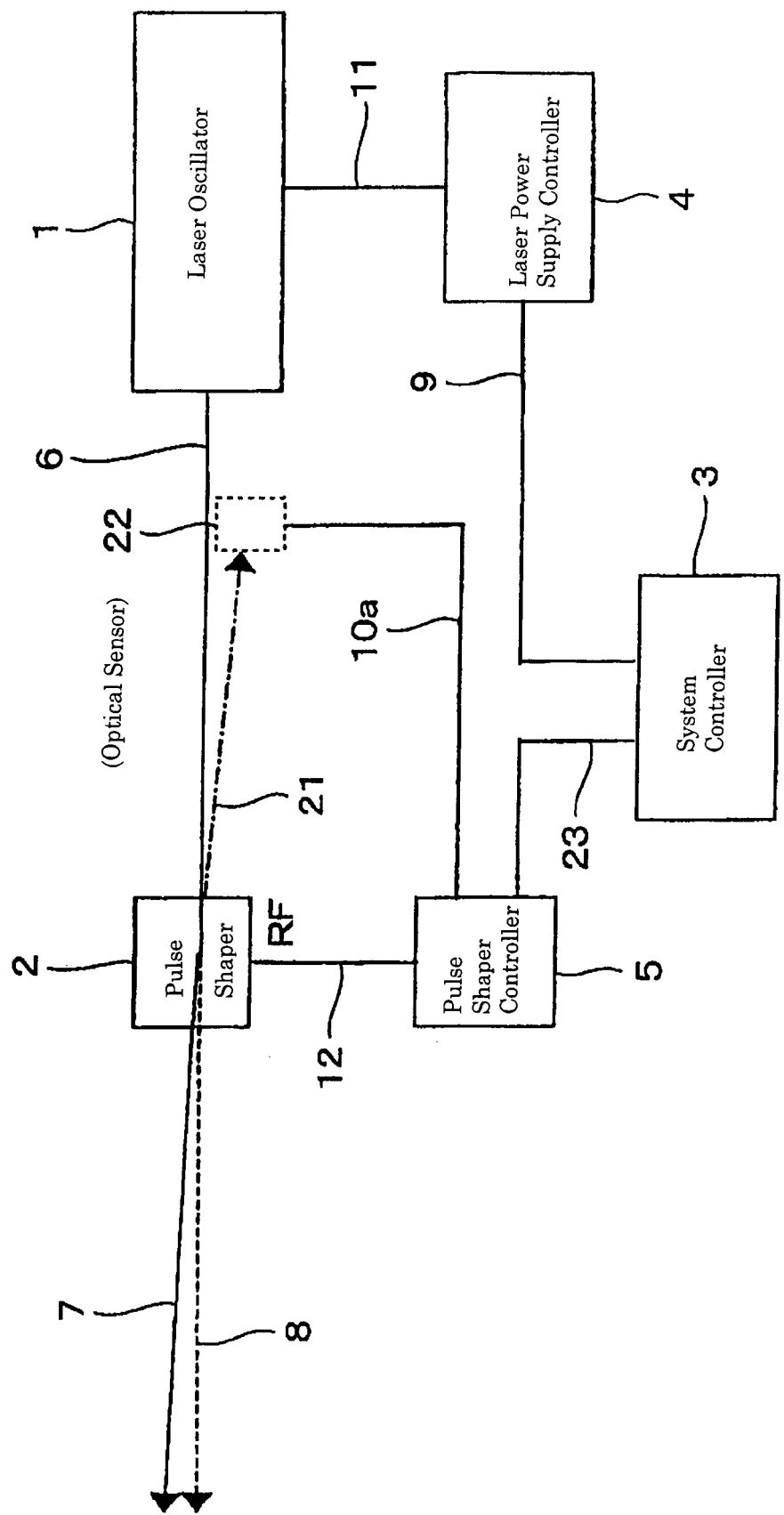
FIG. 6 is a configuration diagram of a laser machining apparatus according to a second embodiment of the present invention.
Figure 10:
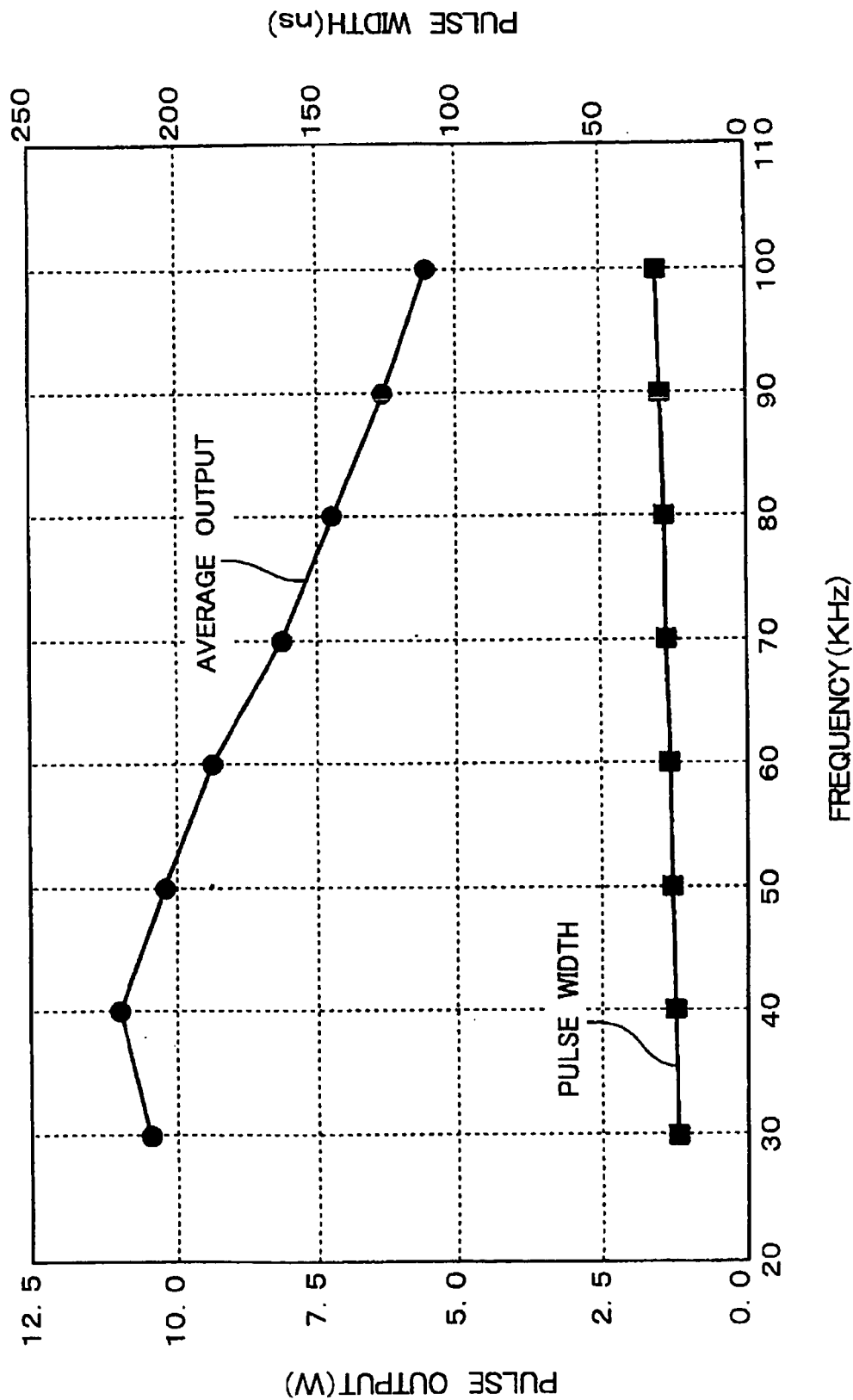
FIG. 10 is an output characteristic diagram of a YVO4-pumped UV laser.
Figure 11:
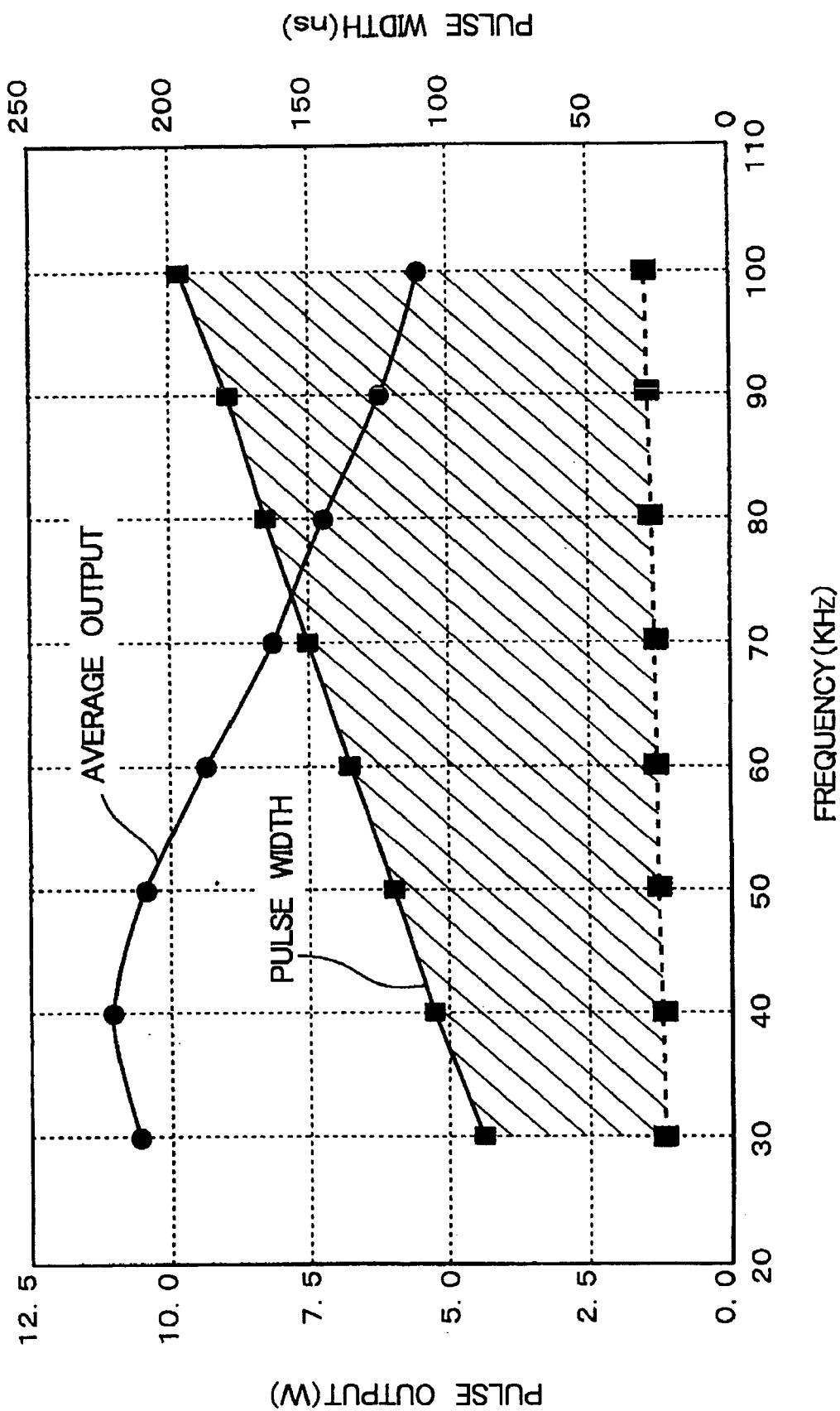
FIG. 11 is an output characteristic diagram of a YAG-pumped UV laser.

FIG. 6 is a configuration diagram of a laser machining apparatus according to a second embodiment of the present invention. Parts or functions the same as those in FIG. 1 in the first embodiment are referenced correspondingly, and redundant description thereof will be omitted.

An optical sensor 22 is connected to a pulse shaper controller 5. When reflected light 21 reflected by the surface of a pulse shaper 2 is detected, a detection signal 10a is outputted to the pulse shaper controller 5. The working speed of the optical sensor 22 is about several nanometers.

In this embodiment, a system controller 3 issues a pulse mode signal 23, that is, an on-time T2 of the pulse shaper 2 to the pulse shaper controller 5.

FIGS. 7A–7G are time charts showing the operation of this embodiment. FIG. 7A shows a pulse output instruction signal 9 and an output instruction signal 23, FIG. 7B shows a value of a current supplied to an LD inside a laser oscillator 1, FIG. 7C shows an outgoing beam 6, FIG. 7D shows a #1 branch beam 7, FIG. 7E shows an on/off signal 11 of a Q-SW, FIG. 7F shows the detection signal 10a of the optical sensor 22, and FIG. 7G shows an on/off signal 12 of the pulse shaper 2.

As shown in FIGS. 7A–7G, in this embodiment, even when the Q-SW on/off signal 11 is delayed for the time $T_D$ behind the pulse output instruction signal 9, the output instruction signal 12 and the Q-SW on/off signal 11 can be synchronized substantially because the pulse shaper 2 is operated in response to confirmation that the outgoing beam 6 is outputted. As a result, the waveform of the #1 branch beam 7 can be made precise and uniform.

Incidentally, the optical sensor 22 may be provided not outside the laser oscillator 1 but inside the laser oscillator 1 so as to catch reflected light, branch light and scattering light.

Although the pulse width and the peak output of the #1 branch beam 7 are changed stepwise in accordance with the material of the piece to be machined in the first and second embodiments, control may be made so that the pulse width and the peak output of the #1 branch beam 7 are changed continuously or adjusted both stepwise and continuously in accordance with the progress of machining. Due to such control to adjust the pulse width and the peak output of the #1 branch beam 7 continuously or stepwise and continuously, for example, the quality of a border portion between a copper layer and an insulating layer or a border portion between the insulating layer and a hole bottom conductor layer can be improved.

When the copper conductor layer is machined with a long-pulse-width beam (that is, the #1 branch beam 7 having a long pulse width), flying matters may appear in the hole entrance or the shape of the hole entrance may be enlarged. When the transmittance and the on-time T2 of the pulse shaper 2 are selected in accordance with the material to be machined, such an influence can be improved.

When an acousto-optic device (AOM or EOM) is used as the pulse shaper 2, the pulse width is affected by an in-crystal beam diameter transit time $\tau$ of an ultrasonic wave ($\tau=D/V$, where D designates the beam diameter and V designates the in-crystal transit speed of the ultrasonic wave). That is, as the incident beam diameter D of the beam incident on the pulse shaper 2 is larger, the transit time (response speed) $\tau$ becomes longer, and the leading edge of the output becomes slower.

When the crystal is made from $SiO_2$, the in-crystal transit speed V of the ultrasonic wave is 5.96 km/s. Accordingly, for example, when D=0.3 mm, the response speed $\tau$ is 50 ns. On the other hand, the delay time for the ultrasonic wave to reach the beam is 50 ns on the assumption that the distance between a transducer (a source for oscillating the ultrasonic wave) and the beam is 0.3 mm. Thus, the pulse width controllable range is 50 ns or longer on practical use.

On the other hand, when the frequency of the ultrasonic wave is 40 MHz, the electric resolution is 25 ns (full-wave rectification 12.5 ns). Accordingly, in order to minimize the resolution, the on signal to the AOM (pulse shaper 2) may be synchronized with the detection signal of the optical sensor 22, or a plurality of clocks may be provided so that the closest clock is selected to turn on the AOM. Thus, the electric delay can be shortened to several nanoseconds.

When the pulse shaper 2 is formed as a combination of an electro-optic device using a polarization modulation system, a quarter-wave plate and a Brewster plate, the response speed can be improved to several nanoseconds. Thus, the pulse width can be controlled to be 20–100 ns. In addition, the pulse leading edge can be controlled so that the shape of the #1 branch beam 7 can be controlled more minutely.

The other parts which have not been described especially are arranged in the same manner as in the first embodiment, and have functions equivalent to those in the first embodiment.

The present invention is not limited to a glass-containing material. It is also effective in machining a closed-end hole in a build-up layer using a resin-including copper conductor layer RCC material (made from a copper conductor layer and a resin insulating layer) or machining a closed-end hole in a build-up layer using only a resin insulating layer, as shown in FIGS. 8A–8C.

When the delay time TD for which the Q-SW on/off signal 11 is delayed behind the pulse output instruction signal 9 is known in the first embodiment, a timer element may be provided to design the pulse shaper 2 to operate when the delay time $T_D$ has passed since the output of the pulse output instruction signal 9. In this case, it is not necessary to provide the optical sensor 22 described in the second embodiment.

Further, the present invention is also applicable to machining a through hole in a multi-layer board (made from an outer copper conductor layer, an inner copper conductor layer, a glass-including build-up layer and a glass-including core layer 32) when a beam mode optimized in accordance with each material is applied by the pulse shaper 2 as shown in FIGS. 9A–9C.

Further, the technique for forming a beam into short pulses according to the present invention is also applicable to a UV laser using a long pulse laser having an internal cavity structure or an external cavity structure, such as a YAG laser or YLF laser ($YVO_4$ laser) as a fundamental wave, a visible light laser and an infrared laser.

According to the aforementioned embodiments, the following effects are obtained.

That is, the real pulse width and the real peak output are adjusted outside the laser oscillator while the frequency of pulses outputted from the laser oscillator and the pulse output are fixed. Thus, the thermal fluctuation inside the laser oscillator can be minimized so that the machining position accuracy can be improved.

In addition, the pulse energy can be adjusted accurately within a range of 100–5%. Accordingly, for example, high-quality machining can be performed even on an FR-4 material (made from copper and glass-containing resin) having a difference of about 10 times between energy thresholds of the components.

Further, machining can be performed, for example, with a pulse width of 25–110 ns (in the case of 40 kHz) which cannot be used in the background art. Accordingly, the hole quality and the hole shape can be controlled easily.

What is claimed is:

1. A laser machining method for irradiating a to-be-machined product with a laser beam to thereby machine said to-be-machined product, comprising the steps of:
   detecting a reflection of a pulsed laser beam output from a surface of a pulse shaper,
   shaping a waveform of said pulsed laser beam, wherein shaping said pulsed laser beam is started synchronously with a detection of said pulsed laser beam output; and
   supplying said shaped laser beam to a portion to be machined.

2. A laser machining method according to claim 1, wherein when said to-be-machined product includes, as pieces to be machined, a metal material layer and at least one of an organic material layer and an inorganic material layer laminated to said metal material layer in a thickness direction of said to-be-machined product, said metal material layer is machined by a laser beam shaped to have a pulse width not shorter than 100 ns, and at least one of said organic material layer and said inorganic material layer is machined by a laser beam shaped to have a pulse width shorter than 100 ns.

3. A laser machining apparatus comprising:
   a laser oscillator for outputting a pulsed laser beam for machining a to-be-machined product;
   a pulse shaper provided on an optical path of said laser beam; and
   an optical sensor for detecting a reflection of said pulsed laser beam from the surface of said pulse shaper;
   wherein a waveform of said laser beam outputted as short pulses is shaped by said pulse shaper,
   wherein said pulse shaper starts shaping said laser beam synchronously with a detection of said reflection, and said shaped laser beam is supplied to a portion to be machined.

4. A laser machining apparatus according to claim 3, wherein when said to-be-machined product includes, as pieces to be machined, a metal material layer and at least one of an organic material layer and an inorganic material layer laminated to said metal material layer in a thickness direction of said to-be-machined product, said pulse shaper changes pulse width of said laser beam between when said metal material layer is machined and when at least one of said organic material layer and said inorganic material layer is machined.

5. A laser machining apparatus according to claim 4, wherein said pulse width is changed to be not shorter than 100 ns when said metal material layer is machined, and to be shorter than 100 ns when at least one of said organic material layer and said inorganic material layer is machined.

* * * * *